(12) United States Patent
Montelius et al.

(10) Patent No.: US 7,165,957 B2
(45) Date of Patent: Jan. 23, 2007

(54) DEVICE FOR TRANSFERRING A PATTERN TO AN OBJECT

(75) Inventors: Lars Montelius, Bjärred (SE); Babak Heidari, Furulund (SE); Thord Stjernholm, Höör (SE)

(73) Assignee: Obducat AB, Malmo (SE)

( * ) Notice: Subject to any disclaimer, the term of this patent is extended or adjusted under 35 U.S.C. 154(b) by 94 days.

(21) Appl. No.: 10/221,331

(22) PCT Filed: Mar. 14, 2001

(86) PCT No.: PCT/SE01/00527

§ 371 (c)(1),
(2), (4) Date: Feb. 4, 2003

(87) PCT Pub. No.: WO01/69317

PCT Pub. Date: Sep. 20, 2001

(65) Prior Publication Data

US 2003/0170053 A1    Sep. 11, 2003

(30) Foreign Application Priority Data

Mar. 15, 2000  (SE) .................................. 0000848

(51) Int. Cl.
*B30B 15/24*    (2006.01)

(52) U.S. Cl. ....................... 425/149; 425/150; 425/383; 425/406; 100/258 A

(58) Field of Classification Search ................ 425/149, 425/150, 383, 406; 100/258 R, 258 A
See application file for complete search history.

(56) References Cited

U.S. PATENT DOCUMENTS

| | | | | |
|---|---|---|---|---|
| 4,873,923 A | * | 10/1989 | Manning | ................. 100/258 R |
| 5,156,782 A | * | 10/1992 | Ballantyne | .................. 264/40.5 |
| 5,427,599 A | * | 6/1995 | Greschner et al. | ............ 65/305 |
| 5,463,892 A | * | 11/1995 | Nakagawa | .................... 72/456 |
| 5,576,147 A | | 11/1996 | Guckel et al. | |
| 5,772,905 A | | 6/1998 | Chou | |
| 5,858,422 A | * | 1/1999 | Brams | ........................ 425/595 |
| 5,947,027 A | | 9/1999 | Burgin et al. | |
| 6,027,595 A | | 2/2000 | Suleski | |
| 6,165,391 A | * | 12/2000 | Vedamuttu | ................. 264/1.33 |
| 6,758,664 B1 | * | 7/2004 | Curtiss et al. | .............. 425/193 |

FOREIGN PATENT DOCUMENTS

| | | | |
|---|---|---|---|
| GB | 2 278 310 A | * | 11/1994 |
| WO | WO 98/55289 | * | 12/1998 |

* cited by examiner

*Primary Examiner*—Donald Heckenberg
(74) *Attorney, Agent, or Firm*—Finnegan, Henderson, Farabow, Garrett & Dunner, L.L.P.

(57) ABSTRACT

A device is provided for transferring a pattern to an object. The device may be used for transferring a pattern, such as micro- or nanostructures, from a stamp to an object. In accordance with one embodiment, the device comprises a first contacting means with a receiving surface for the stamp and a second contacting means with a receiving surface for the object. The device may further include a pressing means that is adapted to operate at least one of the contacting means for contacting the stamp with the object. One of the contacting means may include a base and a holder. The holder has a first end which defines one of the receiving surfaces and a second opposite end which is pivotally connected to the base in such a manner that the stamp and the object are automatically placed in a parallel position when contacting each other.

21 Claims, 4 Drawing Sheets

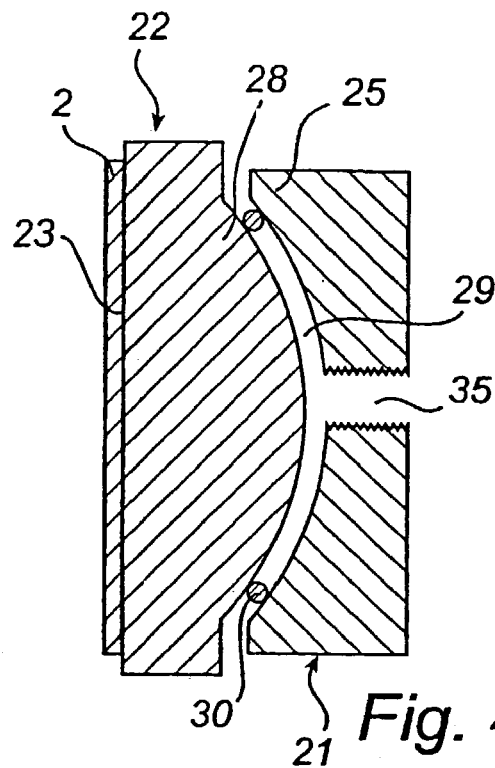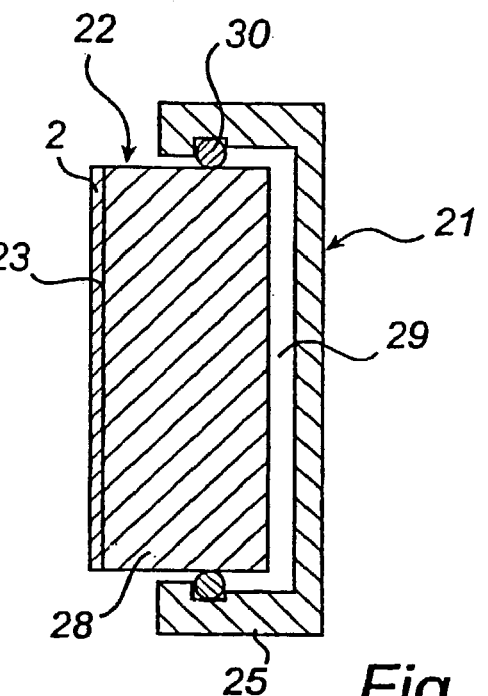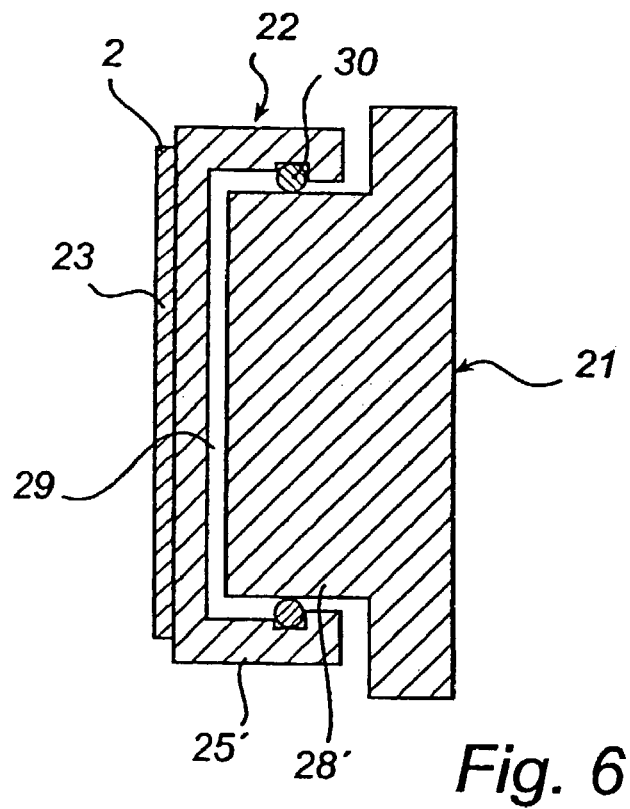

DEVICE FOR TRANSFERRING A PATTERN TO AN OBJECT

This application is a national stage filing under 35 U.S.C. § 371 of International Application No. PCT/SE01/00527, filed on Mar. 14, 2001, which published in the English language. This application also claims the benefit of priority under 35 U.S.C. § 119(a) to SE Patent Application No. 0000848-2, filed on Mar. 15, 2000.

FIELD OF THE INVENTION

The present invention relates generally to transferring a pattern from a stamp to an object. The invention relates especially to production of micro- and nanostructures.

BACKGROUND ART

A promising technique of producing nanostructures, i.e. structures in the order of 100 nm and smaller, is so-called nanoimprint lithography. This technique is described in the document U.S. Pat. No. 5,772,905, which is incorporated herewith by reference. In such lithography, the main steps of which are schematically shown in FIGS. 1a–d, a pattern of nanostructures is transferred from a stamp 1 to an object 2. The object 2 consists of a substrate 2a and, applied thereto, a film 2b of a polymer material (resist). After heating of the film 2b to a suitable temperature, the stamp 1 is pressed into the same (FIG. 1b). The stamp 1 is then released from the object 2 when recesses 3 of a desired depth have been formed in the layer 2b (FIG. 1c). Subsequently any remaining film in the recesses 3 is removed, for instance by etching, thereby exposing the substrate 2a. In subsequent process steps (not shown), the pattern in the film is reproduced in the substrate or in some other material which is applied to the substrate.

A device according to the above-mentioned U.S. patent for carrying out the above lithographic process comprises a first contacting means with a receiving surface for the stamp, a second contacting means with a receiving surface for the object, and a pressing means for contacting or joining the first and second receiving surfaces with each other.

The film applied to the substrate is very thin, typically 50–200 nm. For even structuring of the object, the stamp and the object must thus be mutually parallel with an accuracy of a few nanometres. In industrial applications, the object can have a diameter of about 15–30 cm, which means that the surfaces contacting each other can have a maximum angle of inclination of about $10^{-7}$ rad. A greater inclination between the stamp and the object can, in addition to uneven structuring of the object, also result in the latter being smashed. In fact the substrate is usually made of a brittle material, e.g. $Si/SiO_2$, GaAs or InP, and the pressure exerted upon the substrate during-contacting is high, typically 4–10 MPa.

A conceivable solution to the above problems would be to fix the receiving surfaces of the device in a mutually fully parallel relationship once and for all. This requires, however, that all objects have perfect plane-parallel flat sides. For reasons of manufacture, this is not possible, and therefore the device must be adjusted for each individual object.

According to a previously suggested solution to this problem a plurality of power or pressure sensors are mounted in the receiving surface of the stamp or the object. A control unit is adapted to actively control the mutual angular position of the contacting means based on the thus measured pressure distribution. However, this is an expensive and complicated solution, which is also difficult to scale up for structuring of large objects.

SUMMARY OF THE INVENTION

An object of the invention is to wholly or partly overcome the above problems of prior art. More specifically, it is an object to provide a simple device for transferring a pattern from a stamp to an object with a high degree of mutual parallelism between the stamp and the object.

It is also an object of the invention to provide such a device that allows contacting of the stamp with the object under high pressure.

It is a specific object of the invention to provide a device which is suited for transferring micro- or nanostructures to the object.

These and other objects that will appear from the following description are now achieved by means of a device according to claim 1. Preferred embodiments are defined in the subclaims.

In the inventive device, the receiving surfaces, and the stamp and the object which are received thereon, can be put together in a non-parallel position. When the stamp is contacted with the object, they will automatically be brought into a mutually parallel position by the force acting between them pivoting one receiving surface relative to the other receiving surface. The device is of a simple design and can be formed to allow contacting of the stamp with the object under high pressure. The device can also easily be scaled up for structuring of objects having a greater diameter or thickness.

According to a preferred embodiment, the holder is pivotally connected to the body via coacting male and female portions, which between them define a compartment for receiving a fluid, preferably a hydraulic fluid. Such a device allows soft and gradual contacting of the stamp with the object owing to the fact that the fluid is able to impart a certain amount of inertia to the pivoting motion of the holder. The fluid in the compartment between the male portion and the female portion can also absorb sudden changes in pressure that may arise during contacting, which also promotes soft and gradual contacting. A further advantage of this embodiment resides in the possibility of detecting via a pressure sensor the pressure established in the chamber, which can be converted into an almost exact value of the actual contact pressure between the stamp and the object. Based on the pressure detected by the pressure sensor, the pressing means can thus be caused to produce a well-defined pressure between the stamp and the object.

According to a further preferred embodiment, the male portion is inserted into the female portion in such manner that the compartment encompasses the male portion arranged in the female portion. As a result, the mechanical contact between the male and female portions is minimised.

When the stamp and the object, during contacting, are pivoted to a mutually parallel position, the largest amount of forces is exerted upon the peripheral edges of the object. These forces are minimised in a preferred embodiment by the female portion defining a mouth portion, which is in sealing contact with a circumferential portion of the male portion, and by the circumferential portion having a diameter which is equal to or smaller than the diameter of the receiving surface of the holder.

To achieve an optimally even contacting of the stamp with the object, it is preferable for the female or male portion arranged on the holder to be coaxial with the receiving surface of the holder.

BRIEF DESCRIPTION OF THE DRAWINGS

The invention and its advantages will be described in more detail below with reference to the accompanying schematic drawings which by way of example illustrate currently preferred embodiments of the invention.

FIG. 3b is a sectional view taken in the centre plane of the abutment in FIG. 3a.

FIGS. 4–7 are sectional views taken in the centre plane of abutments according to alternative embodiments of the invention.

DESCRIPTION OF PREFERRED EMBODIMENTS

Figure 1A:
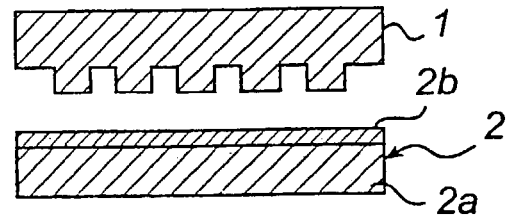
FIGS. 1a–1d illustrate transfer of a pattern from a stamp to a substrate by nanoimprint lithography according to a known process.
Figure 1B:
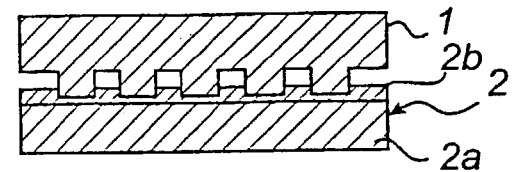
Figure 1C:
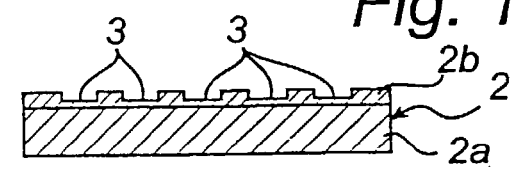
Figure 1D:
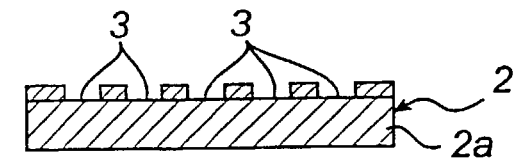
Figure 2:
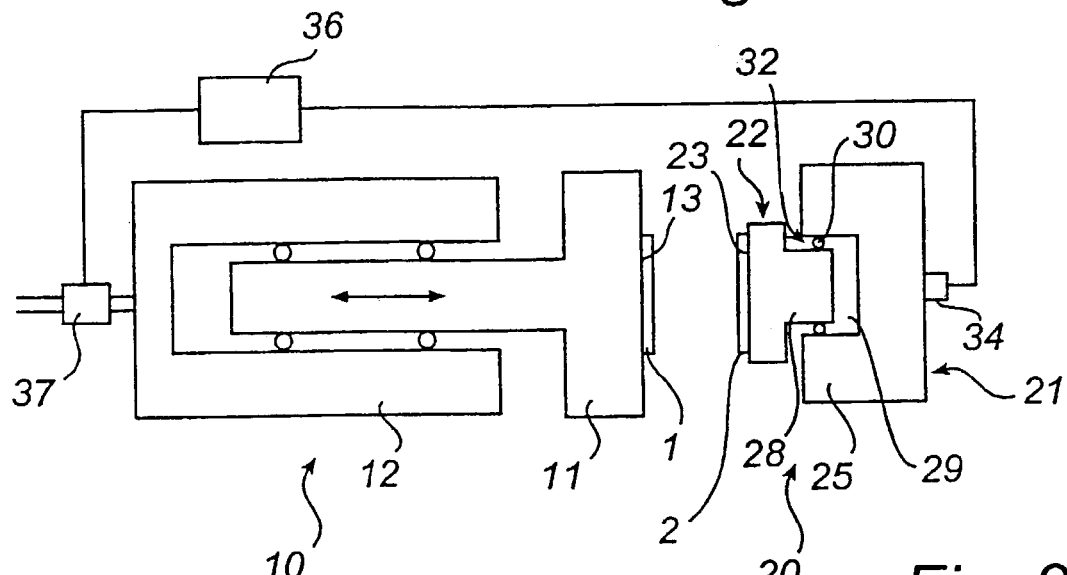
FIG. 2 is a basic sketch of a device according to the first embodiment of the invention.

FIG. 2 is a schematic view of a device according to a first embodiment of the invention. The device, which is intended to transfer a pattern from a stamp 1 to an object 2, comprises a press 10 and an abutment 20 coacting with the press. The press 10, which can be of a prior-art type, such as a hydraulically operated press, has a piston element 11 which is movable back and forth in a well-defined direction relative to a fixedly arranged body 12 of the press 10. The piston element 11 has on its side facing away from the body 12 a surface 13 for receiving the stamp 1.

The device further comprises an abutment 20 which comprises a fixedly arranged base 21 and a holder 22, which on its side facing away from the base 21 has a surface 23 for receiving the object 2. The surface 23 is of essentially the same extent as the object 2 to be received thereon. A locking means (not shown) for securing the object 2 is arranged at the surface 23. This locking means can of an arbitrary kind, but for automatic production it is preferable to use subatmospheric pressure in this securing of the object. The holder 22 is pivotable relative to the base 21, as will be described in more detail with reference to FIGS. 3a–3b.

Figure 3A:
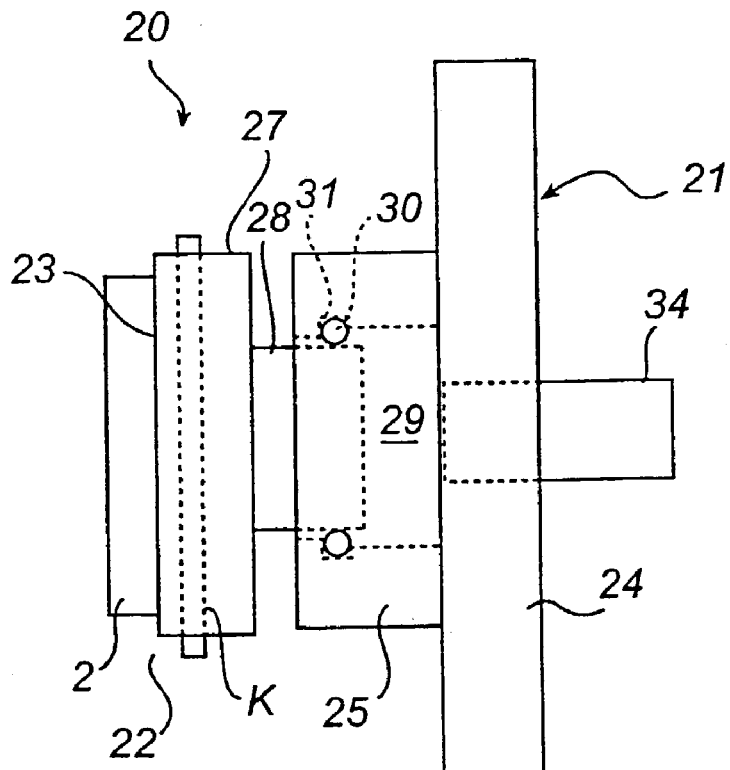
FIG. 3a is a side view on a larger scale of the abutment illustrated in FIG. 2, some inner parts being indicated by dashed lines.
Figure 3B:
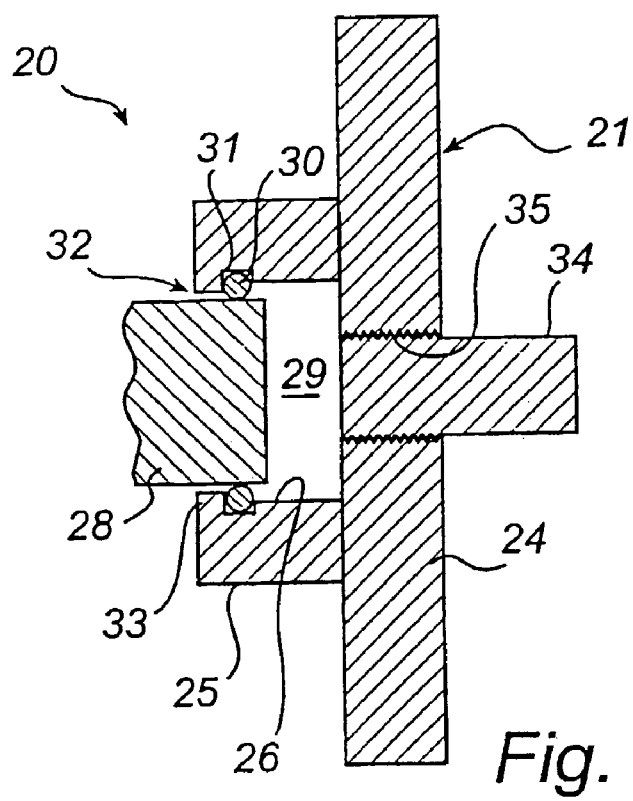

In the embodiment according to FIGS. 3a–3b, the base 21 comprises a vertical supporting plate 24 and a female portion in the form of a projection 25, which is sleeve-shaped and, thus, defines a cavity 26. The holder 22 comprises a base plate 27, which on one side defines the surface 23 and on its other side has a male portion in the form of a projecting shaft 28 which is arranged coaxially with the receiving surface 23. The distal end of the shaft 28 is inserted into the cavity 26 and forms together therewith a closed compartment 29. Both the shaft 28 and the cavity 26 are circular in cross-section. A seal in the form of an O ring 30 is arranged in a circumferential groove 31 at the mouth area 32 of the cavity 26. The O ring 30 rests against the circumferential surface of the shaft 28 to seal the compartment 29 against the ambient air. The compartment 29 is filled with a suitable hydraulic fluid of low compressibility, such as a brake fluid for vehicles.

Figure 7:
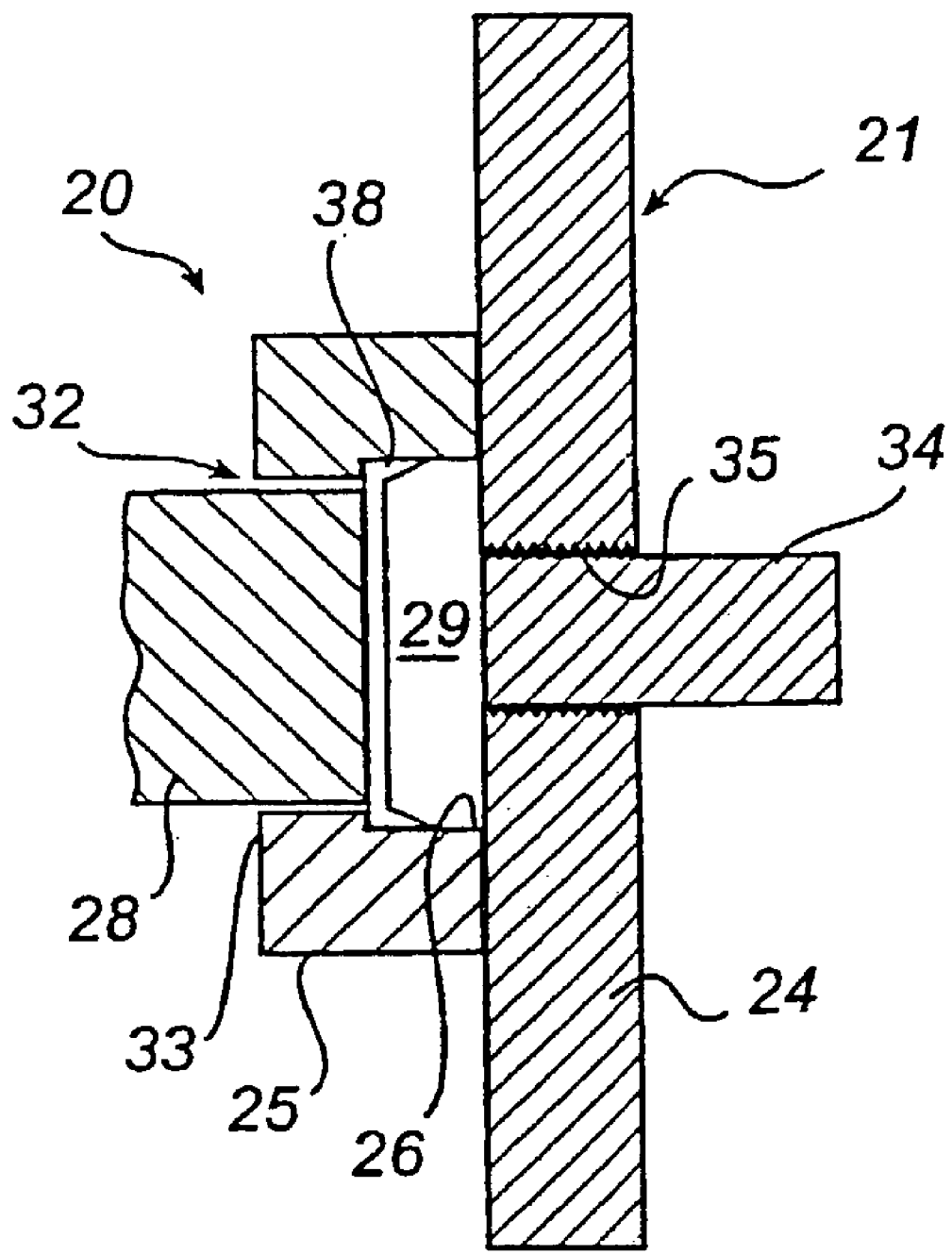

When the stamp 1 is pressed against the object 2, an increased pressure is generated in the compartment 29 and strives to press the O ring 30 out of the groove 31. In order to counteract this, the mouth area 32 has a circumferential guide lug 33 connecting to the groove 31. In order to minimise fluid leakage from the compartment 29 via the O ring 30, a flexible cloth 38, for instance of rubber material, can according to an alternative embodiment as shown in FIG. 7 be sealingly fixed to the inner walls of the compartment, thereby forming a fluid-limiting membrane 38 in the compartment 29. The fluid is caught in the space between the membrane 38 and the inner walls of the compartment 29 and absorbs forces from the distal end of the shaft 28, which distal end abuts against the membrane when the stamp 1 is pressed against the object 2. If there is an O ring as shown in FIGS. 3a–b, this will affect the distal end of the shaft in case of great inclinations of the same. By not having an O ring in this alternative embodiment, the distribution of forces will be more uniform across the entire surface of the stamp while pressing against the object.

A pressure sensor 34 extends through a bore 35 in the supporting plate 24 into contact with the fluid in the compartment 29, either direct or via a partition (not shown). According to FIG. 1, the pressure sensor 34 is connected to a control unit 36, such as a computer. The control unit 36 is connected to the press 10 and controls its contacting of the stamp 1 with the object 2 via a pressure control means 37, e.g. a pump/valve which controls a hydraulic pressure acting on the piston element 11.

In a preferred embodiment, the holder 22 comprises a heating means (not shown) for heating the object 2. Moreover the holder 22 suitably has a cooling means in the form of a cooling loop K which is passed by a cooling medium (FIG. 3a). This allows, in addition to cooling of the object 2, a temperature stabilisation of the shaft 28 to prevent changes in the shape thereof.

The operating mode of the device will be briefly described below with reference to FIG. 1. The control unit 36 actuates the pressure control means 37 to move the piston element 11 towards the immovable abutment 20 for contacting with the same. Normally, the stamp 1 mounted on the piston element 11 is not quite parallel with the object 2 mounted on the abutment 20. In the contacting with the object 2, any inclination between the stamp 1 and the object 2 will be automatically eliminated by the action of forces between them causing the holder 22 to pivot relative to the base 21 about a pivot point located in the centre of the mouth area 32. The fluid in the compartment 29 damps the motion of the holder 22 during the paralleling, thereby allowing the contacting to take place softly. Subsequently the parallel receiving surfaces 13, 23 are pressed against each other until the pressure sensor 34 registers a desired contact pressure, after which the control unit 36 causes the press 10 to lock the piston element 11 for a given period of time. After that the control unit 36 actuates the pressure control means 37 to move the piston element 11 away from the abutment 20, so that the structured object 2 can be removed from the receiving surface 23.

Most satisfactory results have been achieved with the device illustrated in FIGS. 2–3 in the manufacture of micro- and nanostructures. A substrate of $Si/SiO_2$ was provided with a 300 nm thick layer of 950K PMMA. This object was baked at 180° C. for 24 h. Then the object was mounted in the device, after which the PMMA layer was heated to about 170° C. At this temperature, the heating was terminated, and a stamp with a pattern of 300 nm deep structures was pressed against the object at a pressure of about 60 bar for about 1 min. At the same time the object was cooled to about 80° C. The thus structured object had a depth of pattern of about 200 nm with good evenness across the entire substrate, whose diameter in this case was about 5 cm.

FIGS. 4–6 are schematic views of different alternative embodiments of the abutment 20, parts equivalent to those in FIGS. 2–3 having the same reference numerals.

In FIG. 4, the coacting female and male portions 25, 28 of the base 21 and the holder 22 are of a complementary shape, more specifically a part-spherical shape. This embodiment will probably result in a somewhat more flexible contacting of the stamp 1 with the object 2.

In FIG. 5, the receiving surface 23 of the holder 22 is of essentially the same diameter as the circumferential surface of the male portion 28 in the mouth area.

In FIG. 6, the base 21 is provided with a projecting male portion 28' which coacts with a female portion 25 formed in the holder 22.

However, it should be emphasised that the invention is not restricted to the above embodiments and that several modifications are feasible within the scope of the appended claims. For instance, the stamp 1 and the object 2 can change places in the accompanying drawings. In another alternative, the holder 22 is pivotally arranged on the piston element 11 instead of on the base 21 of the abutment 20. According to one more alternative, the abutment 20 is arranged to move towards the piston element 11. It should also be appreciated that the holder 22 in a conceivable embodiment is pivotally connected to the base 21 via a mechanical coupling, instead of the hydromechanical coupling described above.

The invention claimed is:

1. A device for transferring a pattern from a stamp to an object, the device comprising:
   first contacting means with a receiving surface for the stamp;
   second contacting means for contacting the stamp with a receiving surface for the object; and
   pressing means for operating at least one of the first and second contacting means to contact the stamp with the object,
   wherein one of the first and second contacting means comprises a base and a holder, the holder comprising a first end which defines one of the receiving surfaces and a second opposite end pivotally connected to the base through co-acting male and female portions which between them define a closed compartment accommodating an amount of hydraulic fluid, said compartment being sealed to retain the amount of hydraulic fluid within the compartment, and
   wherein said base and holder are coupled together by the pivotal connection allowing said holder to pivot about a single point determined by said pivotal connection, so that the stamp and the object are automatically aligned in a mutually parallel position when contacting each other.

2. A device as claimed in claim 1, wherein the male portion is inserted into the female portion in such a manner that the compartment encompasses the male portion arranged in the female portion.

3. A device as claimed in claim 1, wherein the compartment is formed at the opposite end of the holder.

4. A device as claimed in claim 1, wherein one of the male and female portions is arranged on the holder.

5. A device as claimed in claim 1, wherein the female portion defines a mouth portion that is in sealing contact with a circumferential portion of the male portion.

6. A device as claimed in claim 5, wherein the mouth portion comprises a sealing element that is made of a flexible material and abuts against the circumferential portion of the male portion.

7. A device as claimed in claim 5 or 6, wherein the circumferential portion is substantially circular.

8. A device as claimed in claim 5, wherein the circumferential portion has a diameter that is equal to or smaller than the diameter of the receiving surface of the holder.

9. A device as claimed in claim 1, wherein the male portion is formed at the opposite end of the holder, and wherein the female portion is formed in the base.

10. A device as claimed in claim 1, wherein the female portion is formed at the opposite end of the holder, and wherein the male portion is formed in the base.

11. A device as claimed in claim 1, wherein a pressure sensor is adapted to detect the pressure of a fluid accommodated in said compartment.

12. A device as claimed in claim 11, wherein the pressure sensor is arranged in the base.

13. A device as claimed in claim 11 or 12, wherein a control unit is adapted, based on the pressure detected by the pressure sensor, to cause the pressing means to establish a given pressure between the stamp and the object.

14. A device as claimed in claim 1, wherein the holder comprises a cooling loop to be passed by a cooling medium.

15. A device as claimed in claim 1, wherein the stamp has a pattern of micro- or nanostructures.

16. A device as claimed in claim 1, wherein the object comprises a substrate and a layer of a polymer material applied thereto.

17. A device for transferring a pattern from a stamp to an object, the device comprising:
   first contacting means with a receiving surface for the stamp;
   second contacting means with a receiving surface for the object; and
   pressing means for actuating at least one of the contacting means to contact the stamp with the object,
   wherein one of the first and second contacting means comprises a base and a holder, the holder comprising a first end which defines one of the receiving surfaces and a second opposite end which is pivotally connected to the base through co-acting male and female portions, forming a coupling between said base and holder wherein said coupling comprises a single, closed compartment accommodating an amount of hydraulic fluid, said compartment being sealed to retain the amount of hydraulic fluid within the compartment, and whereby the stamp and the object are automatically aligned in a mutually parallel position when contacting each other.

18. A device as claimed in claim 4, wherein one of the male and female portions is arranged on the holder coaxially with the receiving surface of the holder.

19. A device according to claim 6, wherein said sealing element comprises an O-ring.

20. A device according to claim 19, wherein said O-ring is installed in a groove in said holder.

21. A device according to claim 6, wherein said sealing element comprises a flexible cloth.

* * * * *